(12) United States Patent
Sasaki et al.

(10) Patent No.: US 8,356,575 B2
(45) Date of Patent: Jan. 22, 2013

(54) ION SOURCE AND PLASMA PROCESSING APPARATUS

(75) Inventors: Naruyasu Sasaki, Chigasaki (JP); Saburou Shimizu, Chigasaki (JP); Toshiju Kunibe, Chigasaki (JP)

(73) Assignee: Ulvac, Inc., Kanagawa (JP)

( * ) Notice: Subject to any disclaimer, the term of this patent is extended or adjusted under 35 U.S.C. 154(b) by 1173 days.

(21) Appl. No.: 11/990,787

(22) PCT Filed: Sep. 7, 2006

(86) PCT No.: PCT/JP2006/317758
§ 371 (c)(1),
(2), (4) Date: Feb. 21, 2008

(87) PCT Pub. No.: WO2007/029777
PCT Pub. Date: Mar. 15, 2007

(65) Prior Publication Data
US 2009/0250340 A1 Oct. 8, 2009

(30) Foreign Application Priority Data

Sep. 9, 2005 (JP) ................................. 2005-261901

(51) Int. Cl.
*C23C 16/00* (2006.01)
(52) U.S. Cl. ............. 118/723 I; 204/298.11; 118/723 IR
(58) Field of Classification Search ............. 204/298.04, 204/298.11; 250/423, 424; 315/111.81; 118/723 CB, 723 I, 723 IR
See application file for complete search history.

(56) References Cited

U.S. PATENT DOCUMENTS

| | | | | |
|---|---|---|---|---|
| 3,911,314 A | * | 10/1975 | Schulz et al. | 313/361.1 |
| 4,416,755 A | * | 11/1983 | Ceasar et al. | 204/192.11 |
| 5,763,851 A | * | 6/1998 | Forster et al. | 219/121.43 |
| 7,176,469 B2 | * | 2/2007 | Leung et al. | 250/423 R |
| 2002/0000368 A1 | | 1/2002 | Weichart | |
| 2004/0104683 A1 | * | 6/2004 | Leung et al. | 315/111.81 |

FOREIGN PATENT DOCUMENTS

| | | |
|---|---|---|
| JP | 11-251303 | 9/1999 |
| JP | 2000-133497 | 5/2000 |
| JP | 2002-216653 | 8/2002 |
| JP | A2002-5268 | 8/2002 |
| JP | 2004-228181 | 8/2004 |
| WO | WO 00/19483 | 4/2000 |

* cited by examiner

*Primary Examiner* — Keith Hendricks
*Assistant Examiner* — John Brayton
(74) *Attorney, Agent, or Firm* — Carothers and Carothers

(57) ABSTRACT

It is an object of this invention to provide an ion source and a plasma processing apparatus capable of generating stable and long-life plasma. The ion source is provided with a high-frequency antenna (16) installed on the outer peripheral side of a partition wall (15) made of a dielectric material and partitioning a plasma generating chamber (14) and a shield body (26) made of a dielectric material and preventing deposition on the inner peripheral surface of the partition wall (15) facing the high-frequency antenna (16) inside the plasma generating chamber (14). The structure made of a dielectric material can prevent an increase in high-frequency power required for inductive coupling with plasma. The shield body (26) is formed with a slot (26a) in a direction crossing a winding direction of the high-frequency antenna (16). Since this arrangement can prevent continuous deposition on the inner surface of the partition wall in the winding direction of the high-frequency antenna, an induction loss between the high-frequency antenna and the plasma generating chamber can be effectively prevented even if the deposited film is made of a conductive material.

5 Claims, 16 Drawing Sheets

F I G. 12A
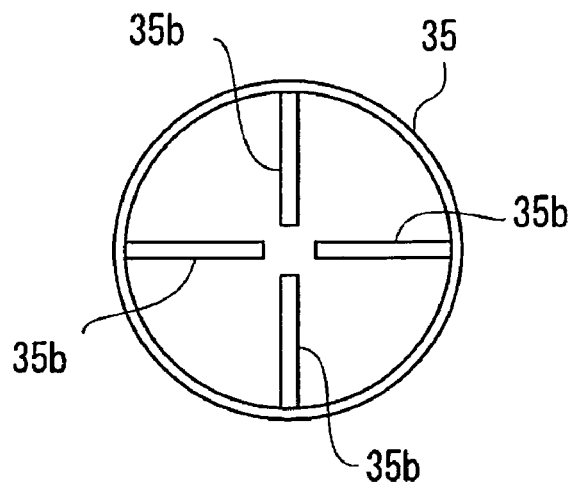
F I G. 12B
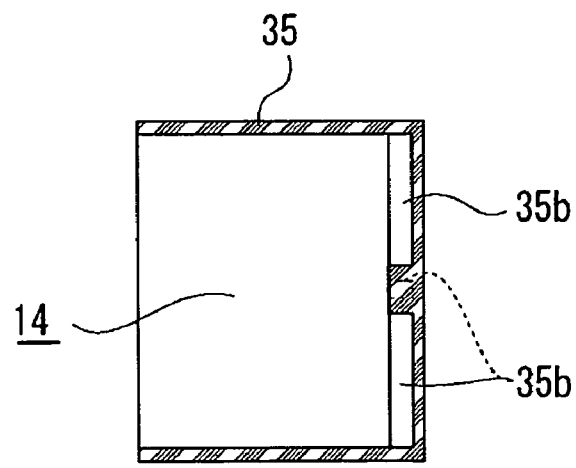

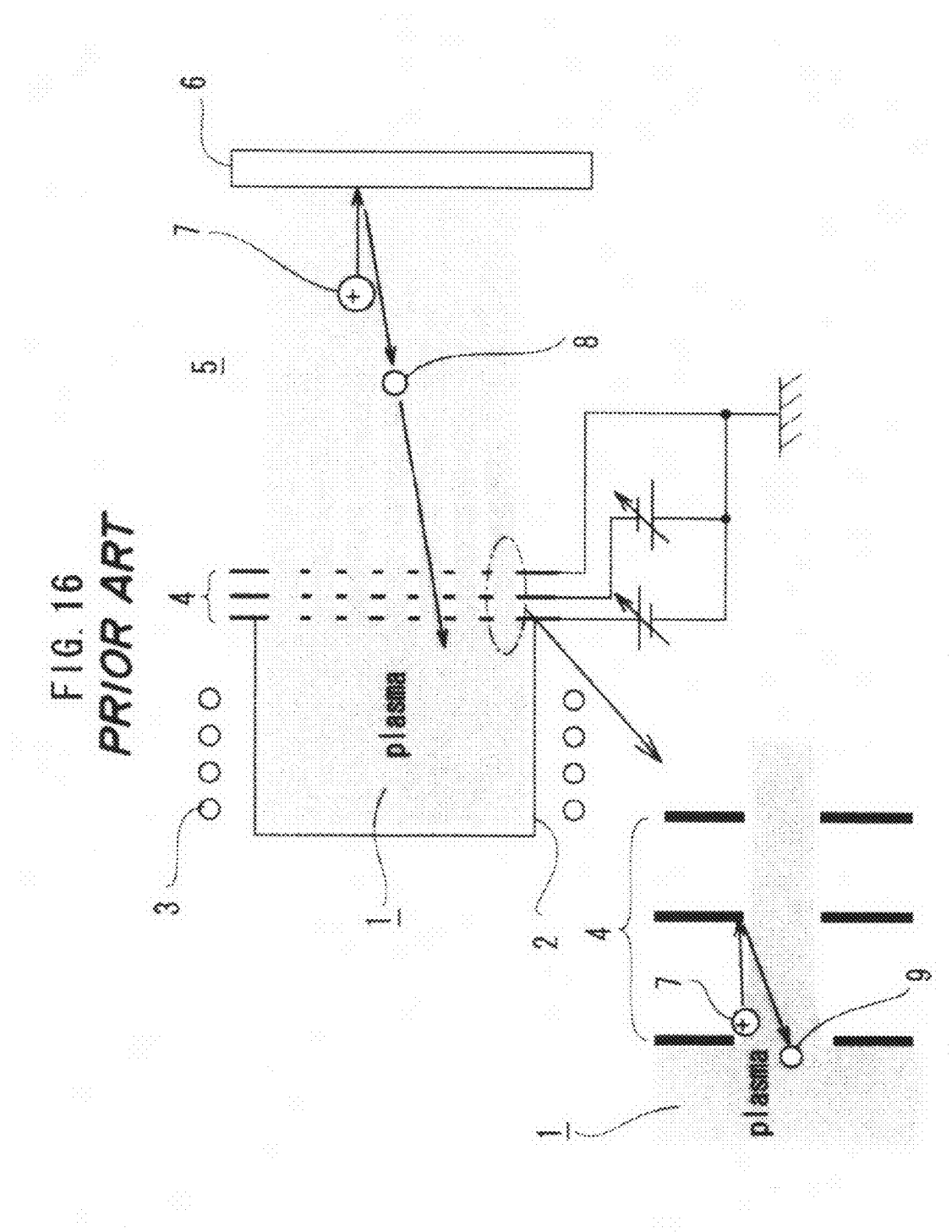

ION SOURCE AND PLASMA PROCESSING APPARATUS

TECHNICAL FIELD

This invention relates to an ion source of the inductive coupling type and a plasma processing apparatus having the same, and more particularly to an ion source and a plasma processing apparatus in which stable generation or maintenance of plasma is enabled by restraining deposition or adhesion on the inner surface of a partition wall that partitions a plasma generating chamber.

BACKGROUND ART

Conventionally, a plasma process is utilized for manufacturing semiconductors and electronic devices or for surface modification of structural materials. Examples of these kinds of plasma processes include ion beam etching and ion beam sputtering. Ion beam etching is the etching process of extracting ions from plasma in the form of a beam and then irradiating a metal film on the surface of a substrate to be processed with the ions. The ion beam sputtering is the sputtering process of extracting ions from plasma in the form of a beam, irradiating a sputtering target with the ion beam, and then depositing the sputtered materials onto a substrate to be processed.

Several ion sources, such as capacitive coupling type, inductive coupling type (ICP type) and electron cyclotron resonance type (ECR type), are known as the plasma processing apparatus mentioned above. As shown in FIG. 16, the ion source of the inductive coupling type includes a plasma generating chamber 1, a partition wall 2 made of a dielectric material and partitioning the plasma generating chamber 1, and a high-frequency antenna 3 arranged externally of the partition wall 2 for generating plasma in the plasma generating chamber 1.

The partition wall 2 is typically made of a dielectric material such as quartz. As shown in FIG. 16, the high-frequency antenna 3 is a coiled shape disposed around the periphery of the partition wall 2 and generates inductively coupled plasma through the partition wall 2. Only ions 7 are accelerated by extraction electrodes 4 from the plasma and are extracted to a process chamber 5. An object matter 6 such as a substrate or a sputtering target is irradiated with the extracted ions 7 and then the predetermined etching process or deposition process is carried out.

In the above conventional ICP type ion source, the object matter 6 is sputtered by the ions extracted from plasma and parts of sputtered materials 8 adhere onto the inner surface of the partition wall 2 partitioning the plasma generating chamber 1. Particularly when the sputtered materials 8 are made of a conductive material and are deposited onto the inner surface of the partition wall 2 in the winding direction of the high-frequency antenna 3 in succession, a current flows to the inside surface of the partition wall 2 in a direction denying an induction electromagnetic field produced in the plasma generating chamber 1. As a result, a dielectric loss is increased. Also, conductive sputtered materials 9 from the extraction electrodes 4, which are generated by collision of ions 7 on the electrodes 4, may adhere onto the inner surface of the partition wall 2 through the plasma generating chamber 1.

As described above, when the conductive materials adhere on the inner peripheral surface of the partition wall 2 around the whole periphery thereof, the dielectric loss is increased and also high-frequency power for obtaining a desired plasma density is increased, thereby finally causing the problem of difficulty in stable formation or maintenance of plasma.

To solve the problem, Patent Documents 1 and 2 disclose a construction in which a shield body for regulating the adhesion of sputtered materials onto the inner surface of a partition wall is installed inside a plasma generating chamber. The shield body is installed opposed to the inner surface of the partition wall. Thus, sputtered materials are restrained from adhering to the inner surface of the partition wall, and then a stable generation or maintenance of plasma is secured.
Patent Document 1: JP2004-228181A
Patent Document 2: JP11-251303A

DISCLOSURE OF INVENTION

Problem to be Solved by the Invention

However, each of the shield bodies disclosed in the Patent Documents 1 and 2 is made of metal and is sputtered through exposure to plasma, thereby causing the problem of metal contamination.

Further, a metallic structure is arranged between a high-frequency antenna and a plasma generating space, thereby increasing the high-frequency power that is necessary for inductively coupling to the plasma in comparison with the case of an absence of the metallic structure. In order to efficiently carry out the inductive coupling between the high-frequency antenna and the plasma, it is necessary to form a plurality of apertures or a large-area aperture at the metallic shield body to transmit an induced electromagnetic field. Therefore, the original effect as a shield is reduced, thereby causing the problem of an increase in adhesion amount onto the inner surface of the partition wall.

Furthermore, in order to improve the effect of restraining the adhesion onto the inner surface of the partition wall, it is necessary to maintain a small gap between the inner wall surface of the partition wall and the shield body. The gap forms a capacitor. In the case where the shield body is made of metal, when the conductivity of the adhering material is much lower (for example, dielectric materials) than that of the shield body, the capacity is varied with age and use. Therefore, stable generation or maintenance of the plasma will be difficult, thereby causing the problem of complicating the design of a matching network which will be compatible with the variation.

This invention has been made in consideration of the above problems. It is an object of this invention to provide an ion source and a plasma processing apparatus capable of generating stable and long-life plasma.

Summary of the Invention

To achieve the above object, an ion source of this invention includes a plasma generating chamber; a partition wall made of a dielectric material and partitioning the plasma generating chamber; a high-frequency antenna arranged on an external portion of the partition wall for generating plasma in the generating chamber; and a structure installed inside the plasma generating chamber, wherein the structure is made of a dielectric material and is restraining deposition on the inner surface of the partition wall facing the high-frequency antenna.

Further, a plasma processing apparatus of this invention includes a process chamber for containing a substrate to be processed; a plasma generating chamber; a partition wall made of a dielectric material and partitioning the plasma generating chamber; a high-frequency antenna arranged on an external of the partition wall and generating a plasma in the plasma generating chamber; and a structure installed inside the plasma generating chamber, in which the structure is made of a dielectric material and restrains deposition on an inner surface of the partition wall facing the high-frequency antenna.

The structure pertaining to this invention can be constructed by a shield body installed in the plasma generating chamber so as to cover the inner surface of the partition wall. Further, the structure can be constructed by a projection or a recess directly formed on the inner surface of the partition wall. Furthermore, the structure can be constructed by a combination of the shield body with the projection or the recess.

The high-frequency antenna can be made in a coiled shape wound around the external peripheral portion of the partition wall. Further, the high-frequency antenna can be made in a looped shape wound externally of the top portion of the partition wall. The phrase "the inner surface of the partition wall facing the high-frequency antenna" corresponds to the inner peripheral surface of the partition wall in the former case, and corresponds to the inner surface of the top of the partition wall in the latter case. The structure pertaining to this invention can be constructed according to the construction of the high-frequency antenna.

For example, when the high-frequency antenna is constructed by a coil antenna wound around the external peripheral portion of the partition wall, the structure can be constructed by a cylindrical shield body covering the inner peripheral surface of the partition wall and having a slot formed in a direction crossing the winding direction of the high-frequency antenna. Alternatively, the structure can be constructed by a projection or a recess extended in a direction crossing the winding direction of the high-frequency antenna in at least one part of the inner surface of the partition wall.

On the other hand, when the high-frequency antenna is constructed by a loop antenna wound at the external position of the top of the partition wall, the structure can be constructed by a plane or curved shield body covering the inner surface of the top of the partition wall and having a slot formed in a direction crossing the winding direction of the high-frequency antenna. Alternatively, the structure can be constructed by a projection or a recess extended in a direction crossing the winding direction of the high-frequency antenna in at least one part of the inner surface of the top of the partition wall.

Thereby, the deposition of the adhesion materials can be prevented from forming in series in the winding direction of the high-frequency antenna on the inner surface of the partition wall. Accordingly, the dielectric loss between the high-frequency antenna and the plasma generating chamber can be effectively reduced even if the deposition is made of conductive materials. Further, since the structure is made of a dielectric material, the increment of the high-frequency power that is necessary for inductively coupling to the plasma can be restrained, and the plasma can be stably formed and maintained for a prolonged period.

Effect of the Invention

According to this invention, the dielectric loss between the high-frequency antenna and the plasma generating chamber can be reduced and the plasma can be stably formed and maintained for a prolonged period.

BRIEF DESCRIPTION OF THE DRAWINGS

FIGS. 2A and 2B are views explaining a structure of the ion source according to the first embodiment of this invention, in which FIG. 2A is a schematic perspective view thereof and FIG. 2B is a front view thereof;

FIGS. 3A and 3B are views explaining another structure of the ion source according to the first embodiment of this invention, in which FIG. 3A is a schematic perspective view thereof and FIG. 3B is a front view thereof;

FIGS. 4A and 4B are views explaining another structure of the ion source according to the first embodiment of this invention, in which FIG. 4A is a schematic perspective view thereof and FIG. 4B is a front view thereof;

FIGS. 5A and 5B are views explaining a structure of an ion source according to a second embodiment of this invention, in which FIG. 5A is a schematic perspective view thereof and FIG. 5B is a front view thereof;

FIGS. 6A and 6B are views explaining another structure of the ion source according to the second embodiment of this invention, in which FIG. 6A is a schematic perspective view thereof and FIG. 6B is a front view thereof;

FIGS. 7A and 7B are views explaining a structure of an ion source according to a third embodiment of this invention, in which FIG. 7A is a schematic perspective view and FIG. 7B is a front view thereof;

FIGS. 8A and 8B are views explaining another structure of the ion source according to the third embodiment of this invention, in which FIG. 8A is a schematic perspective view thereof and FIG. 8B is a front view thereof;

FIGS. 10A and 10B are views explaining a structure of the ion source according to the fourth embodiment of this invention, in which FIG. 10A is a schematic perspective view thereof and FIG. 10B is a front view thereof;

FIGS. 11A and 11B are views explaining a structure of an ion source according to a fifth embodiment of this invention, in which FIG. 11A is a schematic perspective view thereof and FIG. 11B is a front view thereof;

FIGS. 12A and 12B are views explaining another structure of the ion source according to the fifth embodiment of this invention, in which FIG. 12A is a schematic perspective view thereof and FIG. 12B is a front view thereof;

FIGS. 13A and 13B are views explaining a structure of an ion source according to a sixth embodiment of this invention, in which FIG. 13A is a schematic perspective view thereof and FIG. 13B is a front view thereof;

FIGS. 14A and 14B are views explaining another structure of the ion source according to the sixth embodiment of this invention, in which FIG. 14A is a schematic perspective view thereof and FIG. 14B is a front view thereof;

FIG. 16 is a view explaining a structure and operation of a plasma processing apparatus having a conventional ion source of the inductive coupling type.

Figure 1:
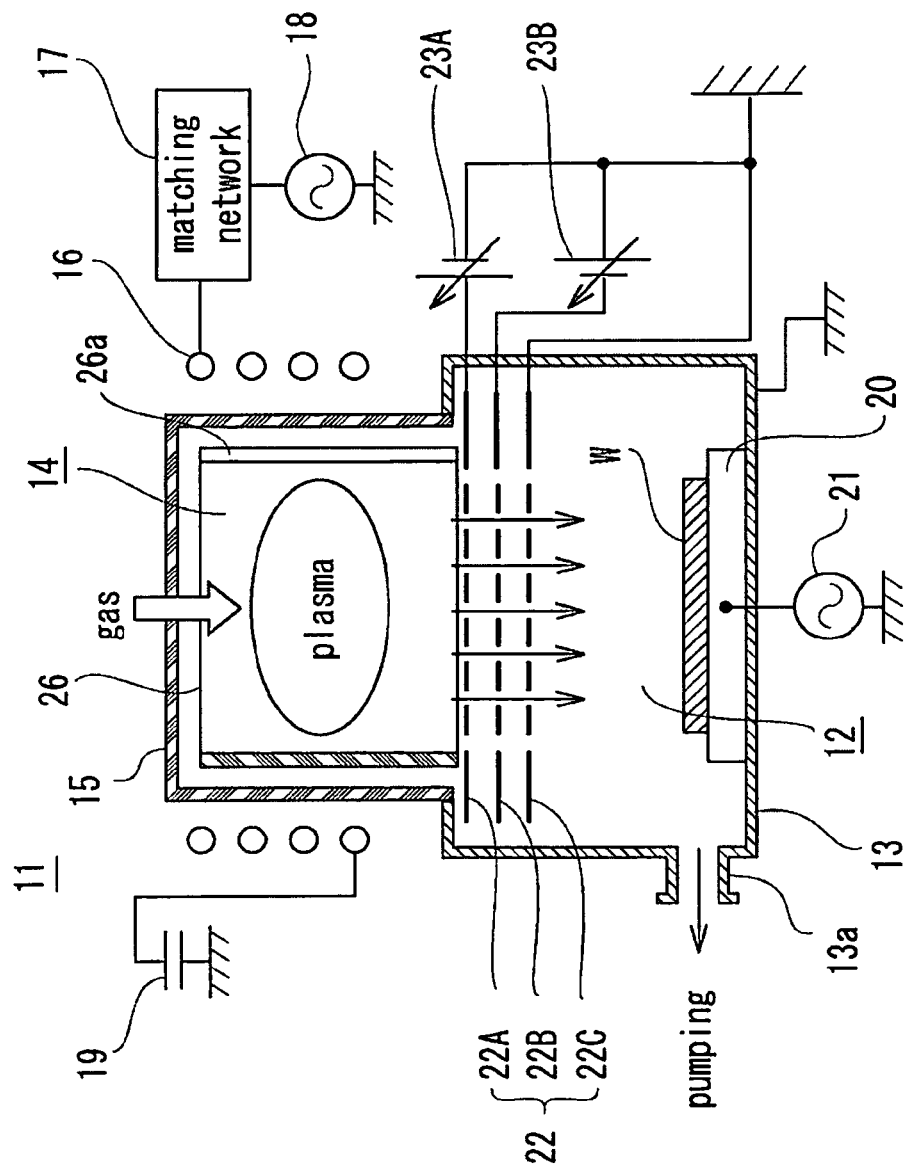
FIG. 1 is a schematic view of a plasma processing apparatus having an ion source according to a first embodiment of this invention.

DESCRIPTION OF REFERENCE SYMBOLS 11 plasma processing apparatus
12 processing chamber
13 vacuum chamber
14 plasma generating chamber
15 partition wall
15a projection
15b recess 16 high-frequency antenna
18 high-frequency power source
20 stage
21 bias power source
22 grid electrode (extraction electrode)
26 shield body
26a slot
31 plasma processing apparatus
34 high-frequency antenna
35 partition wall
35a projection
35b recess
36 shield body
36a slot
W substrate

BEST MODE FOR CARRYING OUT THE INVENTION

Each of embodiments of this invention will be described with reference to the drawings.

First Embodiment

FIG. 1 is a schematic view of a plasma processing apparatus 11 having an ion source according to a first embodiment of this invention. The plasma processing apparatus 11 of this embodiment includes a vacuum chamber 13 containing a processing chamber 12. The processing chamber 12 accommodates a substrate to be processed (hereinafter, simply referred to as "substrate") W such as a semiconductor wafer or a substrate for a liquid crystal panel. The vacuum chamber 13 has an evacuation pipe 13a communicating with vacuum evacuation means (not shown) such as vacuum pumps. Therefore, the inside of the processing chamber 12 can be depressurized to a predetermined vacuum level.

A partition wall 15 is installed at the upper portion of the vacuum chamber 13. The partition wall 15 partitions a plasma generating chamber communicated with the processing chamber 12. The partition wall 15 is made of a dielectric material such as quartz (a quartz bell jar?). A high-frequency antenna 16 wound in a coiled shape is installed at the external of the partition wall 15. One end of the high-frequency antenna 16 is connected to a high-frequency power source 18 through a matching network and another end of the high-frequency antenna 16 is electrically connected to ground potential through a capacitor 19. The power frequency of the high-frequency power source 18 ranges for example from 10 kHz to 100 MHz.

High-frequency power is applied to the high-frequency antenna 16 from the high-frequency power source 18, thereby producing an induced electromagnetic field in a plasma generating chamber 14. Further, a reaction gas is introduced into the plasma generating chamber 14 and is excited by the induction field. Then, plasma of the reaction gas is generated in the plasma generating chamber 14. Thus, the high-frequency antenna 16 generates and stably maintains inductively coupled plasma in the plasma generating chamber 14. A shield body 26 pertaining to this invention is installed in the plasma generating chamber 14 and a detailed description thereof will be given below.

In this embodiment, the reaction gas is introduced from the upper portion of the partition wall 15 into the plasma generating chamber 14 through gas feed lines. Examples of the gas include Ar (argon), $O_2$ (oxygen), $N_2$ (nitrogen), Xe (xenon), or $PH_3$ (phosphine). The gas pressure ranges for example from 0.01 Pa to 10 Pa.

A grid electrode 22 is installed between the processing chamber 12 and the plasma generating chamber 14. The grid electrode 22 corresponds to "the extraction electrode" pertaining to this invention, which extracts ions in the shape of a beam from the plasma generated in the plasma generating chamber 14 to the processing chamber 12. In this embodiment, the grid electrode 22 has a three-layer structure composed of a beam electrode 22A, an accelerating electrode 22B, and a grounding electrode 22C in sequence from the plasma generating chamber 14 side, and these electrodes are respectively made of molybdenum, graphite, or the like.

The beam electrode 22A and the accelerating electrode 22B are respectively connected to variable direct current sources 23A and 23B, and a predetermined positive electric potential is applied to the beam electrode 22A and a predetermined negative electric potential is applied to the accelerating electrode 22B. The acceleration energy of the ions is controlled by adjusting the potential levels of these power supply potentials.

The current value of the ion beam can be obtained by detecting a current flowing to the variable direct current source 23A. The variable direct current source 23A has a current detection function and monitors the ion beam current value in real time. So as to keep the monitored current value to be constant, the ion beam current value is fed back to the high-frequency power source 18 and the electric power to be supplied to the high-frequency antenna 16 is controlled. Therefore, the density of the plasma generated in the plasma generating chamber 14 is maintained to be constant.

As described above, "the ion source" pertaining to this invention is constructed by the plasma generating chamber 14, the partition wall 15, the high-frequency antenna 16, the matching network 17, the high-frequency power source 18, the grid electrode 22, and the like.

Next, the substrate W accommodated in the processing chamber 12 is supported on a stage 20. The substrate W is irradiated with the ion beams extracted by the grid electrode 22. The top surface of the substrate W is covered with a conductive material such as a metal film (there is also the case of partial coating). The metal film is etched by the irradiation of the ion beams. In this embodiment, a high-frequency power source 21 is connected to the stage 20 for biasing, therefore the substrate W can be periodically irradiated with ions from the plasma generated by electric charge conversion between the ion beams and the residual gases.

The etching process of the metal film is not limited in particular. For example, this embodiment can be applied to the process of forming a resist mask pattern of a predetermined shape on the metal film and then forming a wiring pattern by etching the metal film exposed from the openings of the resist mask pattern with ion beams. Further, it can be applied to the case where the whole surface of the metal film is etched back in the damascene process or the like.

In the etching process of the metal film on the substrate with ion beams, sputtered materials from the metal film and the grid electrode 22 scattered by sputtering action of the ion beams adhere and are deposited onto the inner surface of the partition wall 15. When the adhesion or deposition is caused in succession in the winding direction of the high-frequency antenna 16, a current is generated in a direction of denying the induced electromagnetic field that is necessary for formation of plasma. Therefore, an induction loss is increased and stable formation of the plasma becomes difficult.

In view of the above, in this embodiment, the shield body 26 for restraining the adhesion of the sputtered materials onto the inner surface of the partition wall 15 opposed to the high-frequency antenna 16 is installed inside the plasma generating chamber 14. The shield body is a specific example of "the structure" pertaining to this invention. As follows, the details of the shield body 26 will be described referring to FIGS. 2 to 4.

The shield body 26 is made of a dielectric material and is formed in a cylindrical shape. The shield body 26 is installed in the plasma generating chamber 14 so as to cover the inner peripheral surface of the partition wall 15. In this embodiment, the shield body 26 is made of quartz, same as the partition wall 15, but any dielectric materials such as alumina and aluminum nitride can be selected according to applications.

A slot 26a is formed in the shield body 26 in a direction crossing the winding direction of the high-frequency antenna 16 (FIG. 1). In this embodiment, the slot 26a is formed in parallel with the axial direction of the cylindrical shield body 26, and therefore the slot 26a is approximately perpendicular to the winding direction of the high-frequency antenna 16. According to this embodiment, the sputtered materials are prevented from depositing in series in the winding direction of the high-frequency antenna 16 (in the circumferential direction of the shield body 26). Therefore, the generation of the current flowing along the inner surface of the shield body 26 is prevented.

The gap between the shield body 26 and the partition wall 15 is preferably small in order to prevent the adhesion from depositing onto the inner surface of the partition wall 15 through an interstice between the outer peripheral surface of the shield body 26 and the inner peripheral surface of the partition wall 15. Preferably, the shield body 26 and the partition wall 15 are closely placed so that the gap therebetween becomes about 1 mm in width.

Figure 2A:
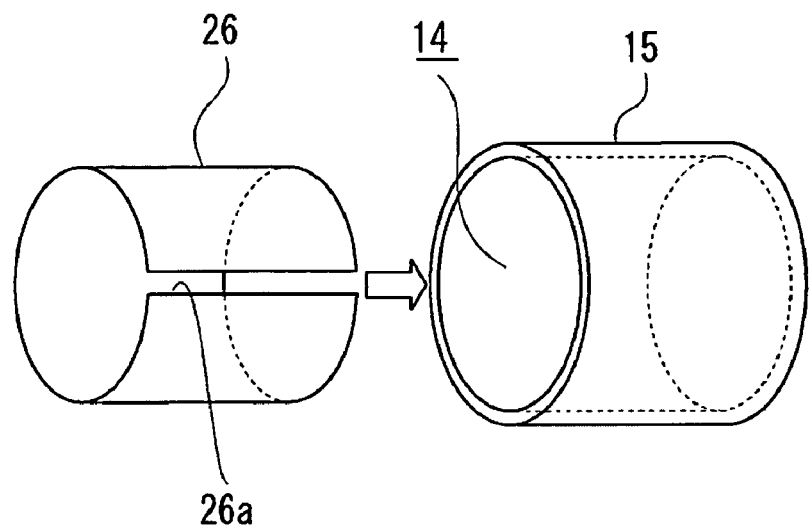
Figure 2B:
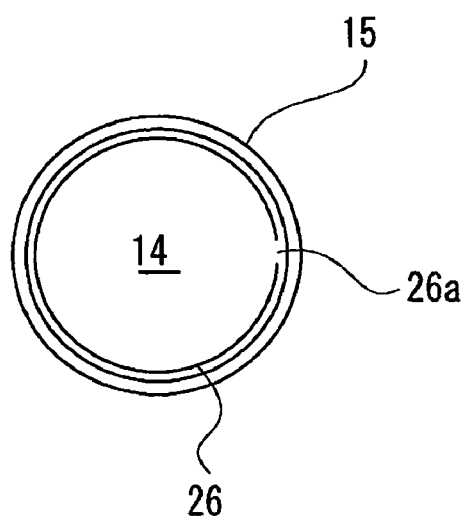
Figure 3A:
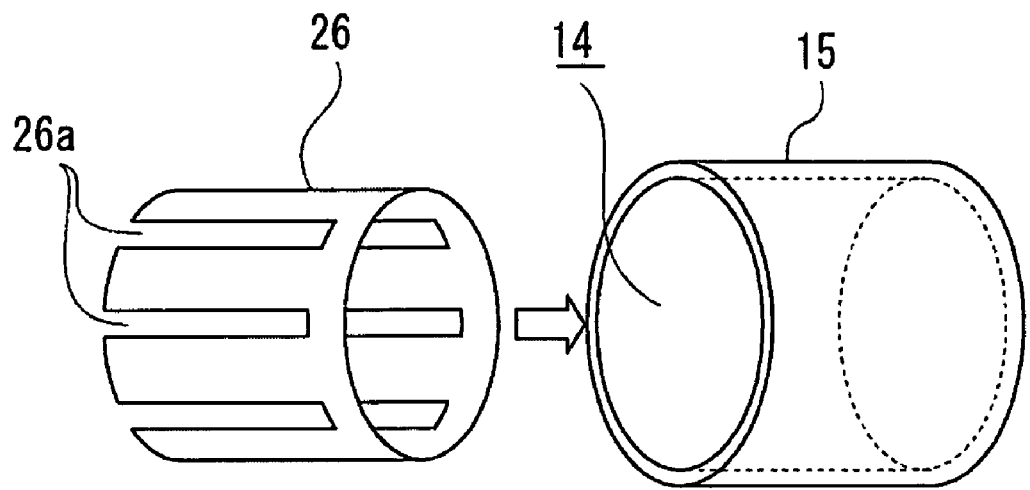
Figure 3B:
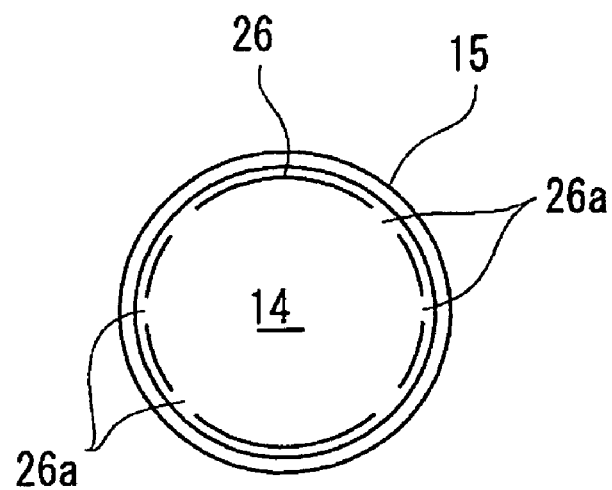
Figure 4A:
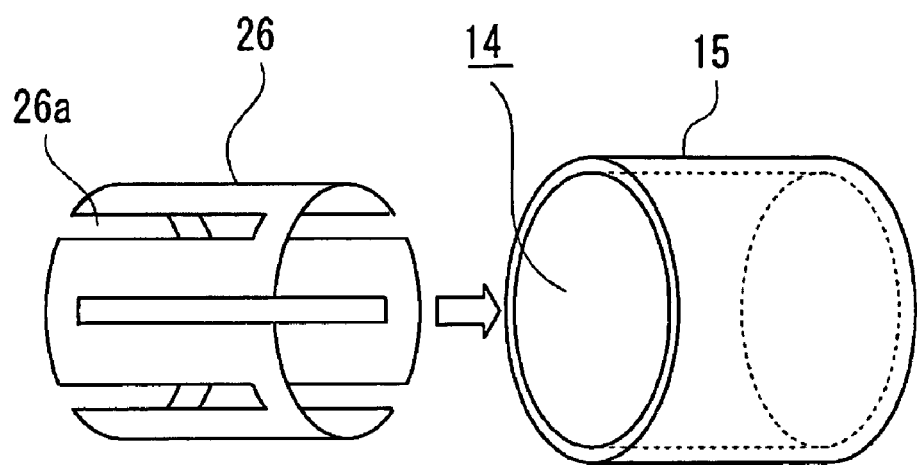
Figure 4B:
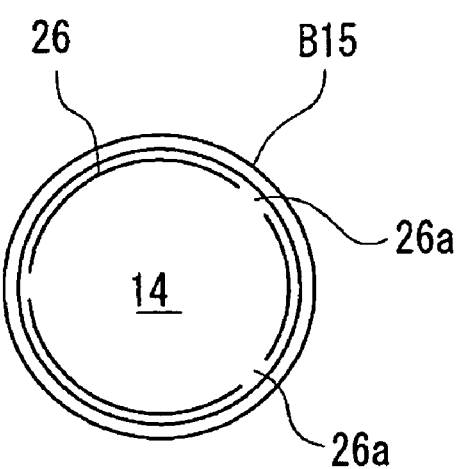

It is desirable that the slot 26a of the shield body 26 be formed to have a length long enough to divide the shield body 26 as shown in FIG. 2A. On the other hand, each slot 26a is formed to have a length so as not to divide the shield body 26 when a plurality of slots 26a is formed, as shown in FIGS. 3 and 4. Especially as shown in FIG. 4, the plurality of slots 26a is formed alternately from the ends of shield body 26. Therefore, the generation of the induced current caused by the deposition can be largely reduced since there is no part that continues in the circumferential direction of the shield body 26.

Although the width of the slot 26a is not limited, the width is preferably narrow within such a range that a closed-loop in the circumferential direction of the shield body 26 can be prevented, from a point of view of reducing the deposition onto the inner surface of the partition wall 15. The slot 26a may be formed only at the area where the high-frequency antenna 16 is wound.

As for the installation of the shield body 26 in the plasma generating chamber 14, the shield body 26 is fixed to the partition wall 15 with an appropriate jig which is not shown. The construction material of the jig is not limited in particular, but the jig is preferably made of dielectric materials from a point of view of metal contamination evasion. The shape of the shield body 26 is not limited to cylindrical. It is possible to arrange a plurality of strip shaped shields opposite to the inner surface of the partition wall 15 through a predetermined minute airspace (for example about 1 mm).

As shown in FIG. 1, the lower end of the shield body 26 is positioned at the neighborhood of the grid electrode 22 (beam electrode 22A). This is because when the plasma is attracted to grounding portions of the vacuum chamber 13 and the like, the distribution of the plasma is disturbed and metal contamination is caused by sputtering the vacuum chamber with ions. The lower end of the shield body 26 is positioned at the neighborhood of the grid electrode 22 or is contacted to the grid electrode 22, with the result that bad effects caused by the leak of the plasma as described above can be avoided. The distance between the lower end of the shield body 26 and the grid electrode 22 is preferably small and it is verified that the distance of equal to or less than 1 mm is effective. In this embodiment, the distance therebetween is set to about 0.5 mm.

In this embodiment as described above, the shield body 26 is installed inside the plasma generating chamber 14 for the purpose of covering the inner surface of the partition wall 15. Therefore the sputtered materials scattered from the surface of the substrate W during the ion beam etching process thereof in the processing chamber 12 are prevented from adhering and depositing onto the inner surface of the partition wall 15 around the whole of inner peripheral surface thereof. Although the sputtered materials adhere to the inner surface of the shield body 26, the deposition of the sputtered materials is never formed in series in the peripheral direction of the inner surface of the shield body 26 since the shield body 26 has the slot 26a.

According to this embodiment, the deposition of the sputtered materials can be prevented from forming in series in the winding direction of the high-frequency antenna 16. Therefore the dielectric loss between the high-frequency antenna 16 and the plasma generating chamber 14 is effectively reduced even if the deposition has electrical conductivity. Similar effect can be obtained when the sputtered materials have enough conductivity to generate an induced current by the high-frequency antenna 16, not limiting to the case where the sputtered materials are made of high conductive materials.

Further, since the shield body 26 is made of a dielectric material, the increment of the high-frequency power that is necessary for inductively coupling to the plasma can be restrained, and the plasma can be stably formed and maintained for a prolonged period. Furthermore, since the shield body 26 is made of a dielectric material, the problem of metal contamination due to the shield body being made of metal does not occur.

Second Embodiment

Then subsequently, FIGS. 5 and 6 show other embodiments of "the structure" pertaining to this invention. Parts that correspond to those in the above first embodiment are denoted by the same reference numerals. Therefore the detailed description of these parts will be omitted.

Figure 5A:
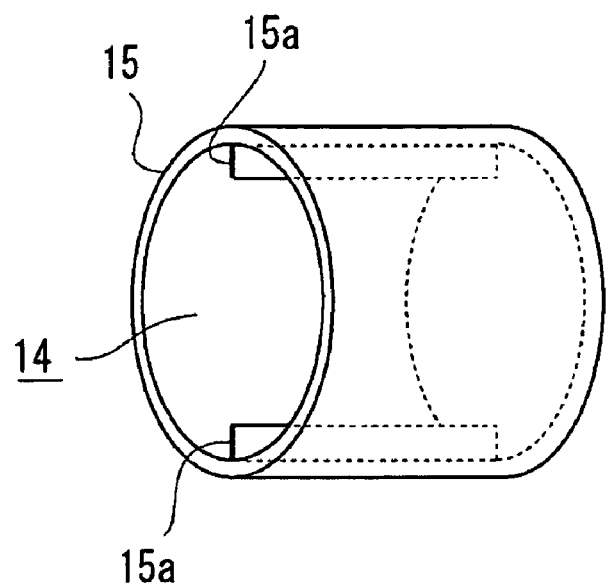
Figure 5B:
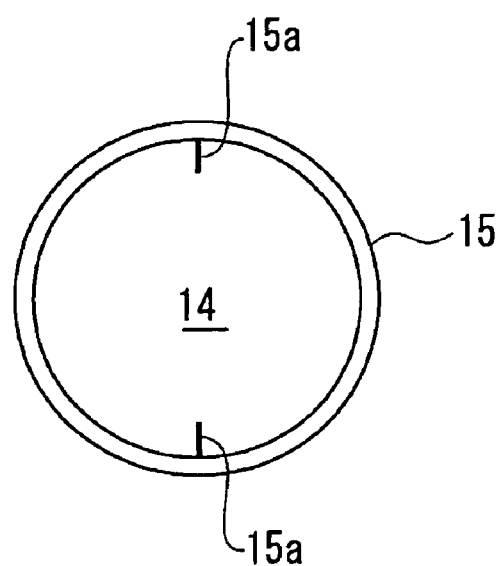

In the embodiment shown in FIGS. 5A and 5B, projections 15a extended in the direction crossing the winding direction of the high-frequency antenna 16 (FIG. 1) are provided. The projections 15a are formed on the inner peripheral surface of the cylindrical partition wall 15 partitioning the plasma generating chamber 14. According to this construction, sputtered materials are prevented from depositing onto the inner surface of the partition wall 15 in series in the peripheral direction thereof by the projections 15a. Therefore, the dielectric loss of the high-frequency antenna 16 can be reduced.

When the sputtered materials adhere onto both sides of the projection 15a, a direction of the current flowing to the tip of the projection 15a from the inner surface side of the partition wall 15 and another direction of the current flowing to the inner surface side of the partition wall 15 from the tip of the projection 15a are opposite to each other. Thus, the induced current at this portion can be canceled or reduced.

Although in the embodiment shown in FIG. 5, the projections 15a are formed at two places on the inner peripheral surface of the partition wall 15 at 180-degree intervals about a center thereof, the projection 15a may be formed on only at least one part of the inner peripheral surface of the partition wall 15. Further, the projections 15a may be radially formed equiangularly or non-equiangularly at three or more places.

It is desirable that the height of the projection 15a be equal to or larger than its width (aspect ratio is equal to or more than 1). More specifically, the height of the projection 15a is equal to or larger than 1 mm when the width of the projection 15a is equal to 1 mm. The projection 15a is made of a dielectric material and may be formed integrally with the inner peripheral surface of the partition wall 15 or may be attached as another member.

Figure 6A:
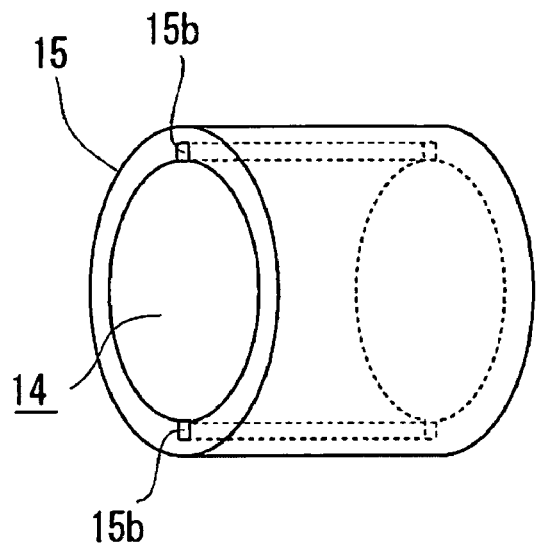
Figure 6B:
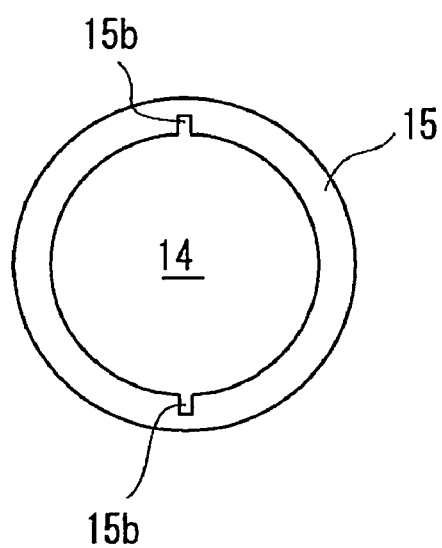

On the other hand, in the embodiment shown in FIGS. 6A and 6B, recesses 15b extended in the direction crossing the winding direction of the high-frequency antenna 16 (FIG. 1) are provided. The recesses 15b are formed on the inner peripheral surface of the cylindrical partition wall 15 partitioning the plasma generating chamber 14. According to this construction, sputtered materials are prevented from depositing onto the inner surface of the partition wall 15 in series in the peripheral direction thereof by the recesses 15b. Therefore, the dielectric loss of the high-frequency antenna 16 can be reduced.

When the sputtered materials adhere onto both sides of the recess 15b, a direction of the current flowing to the bottom of the recess 15b from the inner surface side of the partition wall 15 and another direction of the current flowing to the inner surface side of the partition wall 15 from the bottom of the recess 15b are opposite to each other. Therefore the induced current at this portion can be canceled or reduced.

Although in the embodiment shown in FIG. 6, the recesses 15b are formed at two places on the inner peripheral surface of the partition wall 15 at 180-degree intervals about a center thereof, the recess 15b may be formed on only at least one part of the inner peripheral surface of the partition wall 15. Further, the recesses 15b may be radially formed equiangularly or non-equiangularly at three or more places.

It is desirable that the depth of the recess 15b be equal to or larger than its width (aspect ratio is equal to or more than 1). More specifically, the depth of the recess 15b is equal to or larger than 1 mm when the width of the recess 15b is equal to 1 mm. The recess 15b is concavely formed on the inner peripheral surface of the partition wall 15.

As described above, the projection 15a or the recess 15b is constructed as "the structure" pertaining to this invention, with the result that the effect similar to the first embodiment can be obtained.

Third Embodiment

FIGS. 7 and 8 show a third embodiment of this invention. Parts that correspond to those in the above first and second embodiments are denoted by the same reference numerals. The detailed description of these parts will be omitted.

In this embodiment, a structure is provided in which the shield body 26 described in the first embodiment and the inner surface structure of the partition wall 15 described in the second embodiment are combined.

Figure 7A:
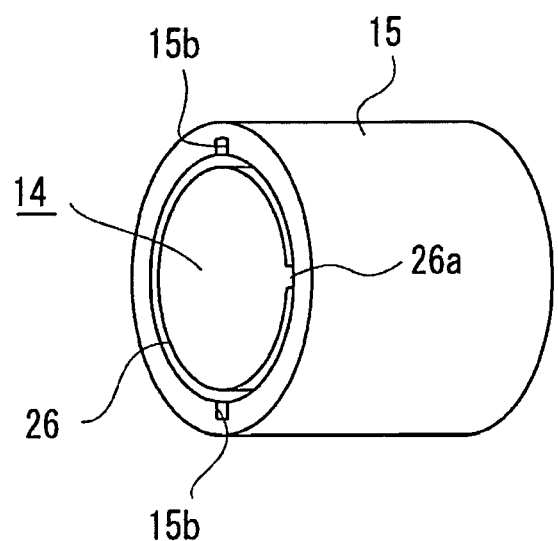
Figure 7B:
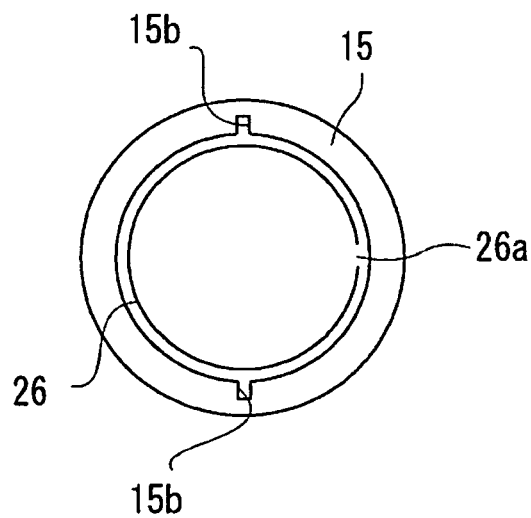

In the embodiment shown in FIGS. 7A and 7B, the recesses 15b are formed on the inner peripheral surface of the cylindrical partition wall 15 partitioning the plasma generating chamber 14. The recesses 15b are extended in the direction crossing the winding direction of the high-frequency antenna 16 (FIG. 1). Further, the shield body 26 is made of a dielectric material and is installed inside the partition wall 15. The slot 26a is formed at the shield body 26 in the direction crossing the winding direction of the high-frequency antenna 16.

With this construction, when sputtered materials adhere onto the inner peripheral surface of the partition wall 15 through the gap between the partition wall 15 and the shield body 26, the deposition composed of the sputtered materials are difficult to form in series in the winding direction of the high-frequency antenna 16, with the result that a maintenance cycle can be prolonged. In addition, the slot 26a of the shield body 26 is positioned at different angle from the recesses 15b of the partition wall 15, which can further improve the effect that the maintenance cycle can be prolonged.

Figure 8A:
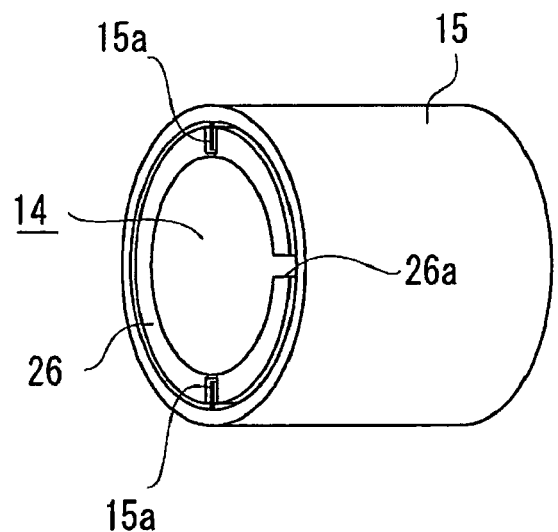
Figure 8B:
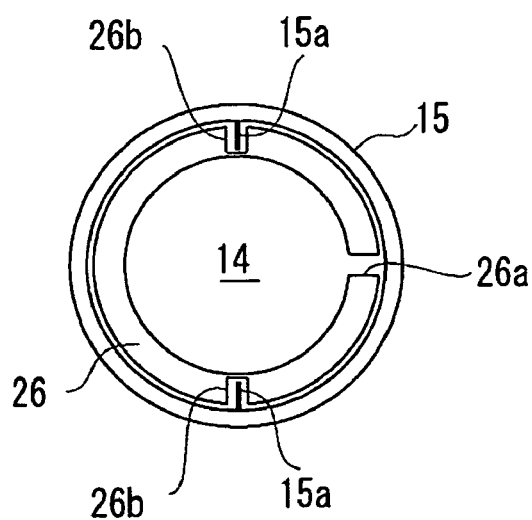

On the other hand, in the embodiment shown in FIGS. 8A and 8B, the projections 15a are formed on the inner peripheral surface of the cylindrical partition wall 15 partitioning the plasma generating chamber 14. The projections 15a are extended in the direction crossing the winding direction of the high-frequency antenna 16 (FIG. 1). Further, the shield body 26 is made of a dielectric material and is installed inside the partition wall 15. The slot 26a is formed in the direction crossing the winding direction of the high-frequency antenna 16. The shield body is formed to be relatively thick and grooves 26b accommodating the projections 15a, respectively, are formed at the positions opposite to the projections 15a.

According to the above construction, the labyrinth structure of the gap between the inner surface of the partition wall 15 and the shield body 26 can be obtained and the effect that the sputtered materials are prevented from adhering in series onto the inner peripheral surface of the partition wall 15 is further improved similarly to the above description.

Fourth Embodiment

Figure 9:
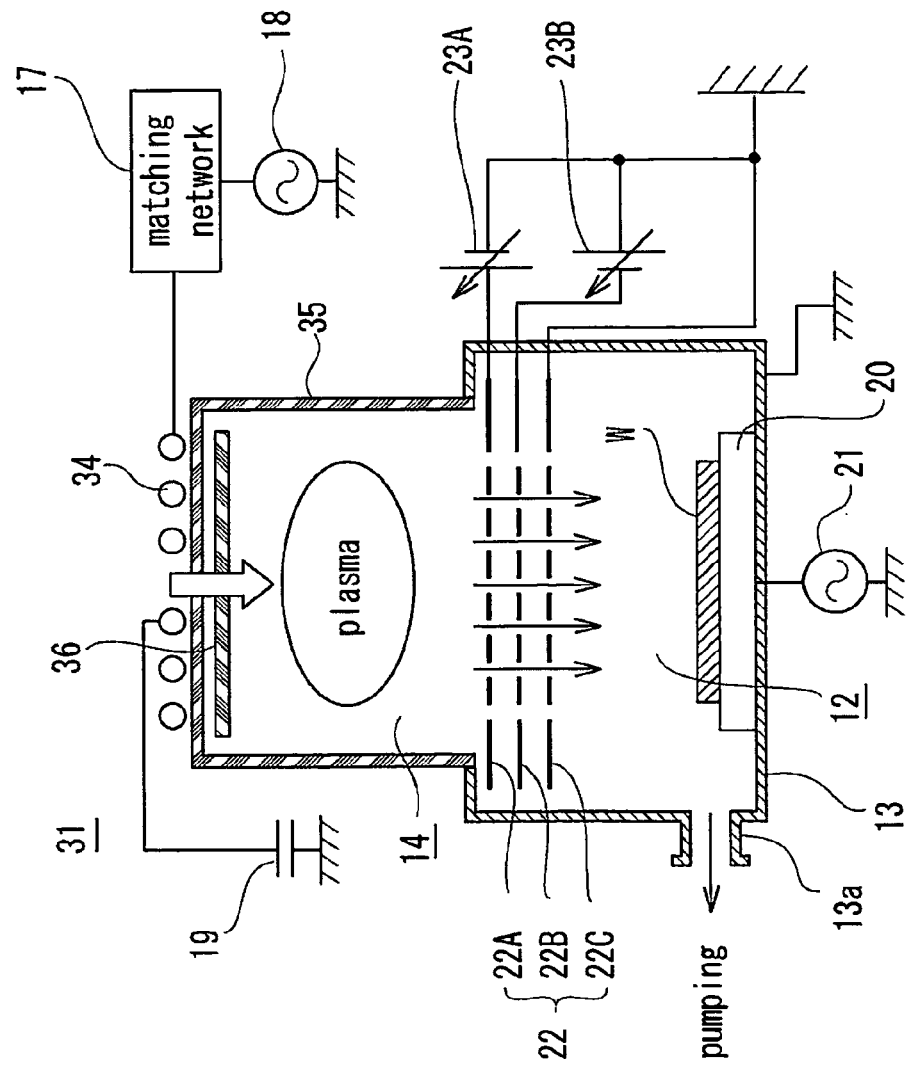
FIG. 9 is a schematic view of a plasma processing apparatus having an ion source according to a fourth embodiment of this invention.

FIGS. 9 and 10 show a fourth embodiment of this invention. Parts that correspond to those in the above first embodiment are denoted by the same reference numerals, the detailed description of these parts being omitted.

A plasma processing apparatus 31 of this embodiment is different from that of the first embodiment in point of including a high-frequency antenna 34 which is wound in the shape of loop (spiral) in a plane, at the external portions of the top of a partition wall 35. The partition wall 35 is made of a dielectric material and partitions a plasma generating chamber 14. A shield body 36 which prevents sputtered materials from adhering onto the inner surface of the top of the partition wall 35 opposite to the high-frequency antenna 34 is installed.

Figure 10A:
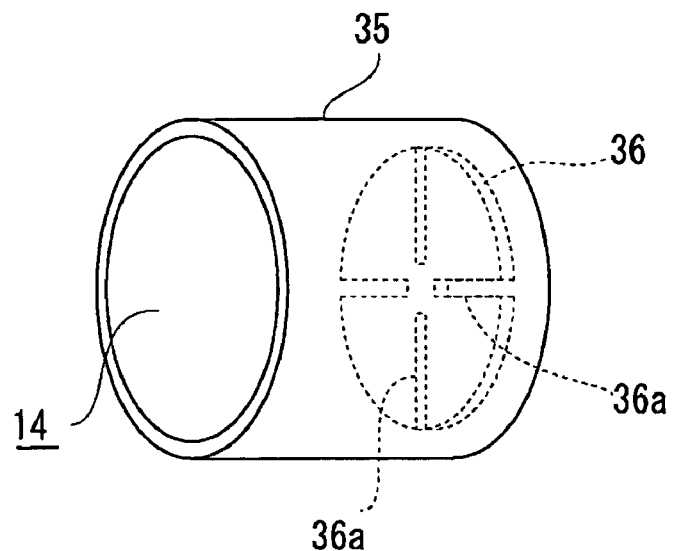
Figure 10B:
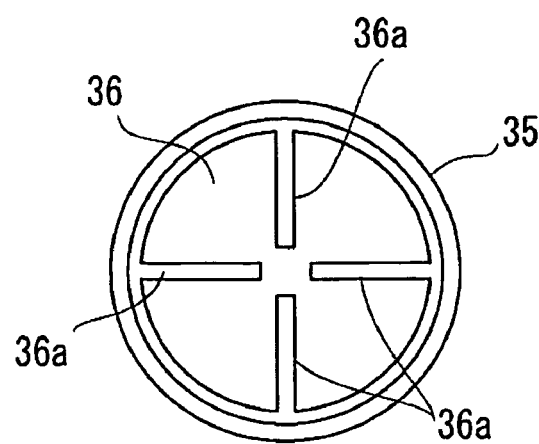

The shield body 36 is made of a dielectric material (for example, quartz) similar to the partition wall 35 and is formed in the shape of disk covering the inner surface of the top of the partition wall 35 as shown in FIGS. 10A and 10B. Slots 36a are formed in the shield body 36 in the direction crossing the winding direction of the high-frequency antenna 34. The number of slots 36a is not particularly limited. In figures, a plurality (four) of slots 36a are radially formed equiangularly, but at least one slot may be provided.

The shield body 36 is closely installed to the inner surface of the top of the partition wall 35 so that the gap between the two is equal to about 1 mm, as in the first embodiment. Therefore, sputtered materials are prevented from invading and adhering onto the inner surface of the partition wall through the gap.

In the plasma generating apparatus 31 of this embodiment as described above, the shield body 36 is installed inside the plasma generating chamber 14 for the purpose of covering the inner surface of the top of the partition wall 35. Therefore the sputtered materials scattered from the surface of the substrate W during the ion beam etching process thereof in the processing chamber 12, are prevented from adhering and depositing onto the inner surface of the top of the partition wall 35. Although the sputtered materials adhere to the inner surface of the shield body 36, the deposition of the sputtered materials is never formed in series in the peripheral direction of the shield body 36 since the shield body 36 has the slots 36a.

According to this embodiment, the deposition of the sputtered materials can be prevented from forming in series in the winding direction of the high-frequency antenna 34. Therefore the dielectric loss between the high-frequency antenna 34 and the plasma generating chamber 14 is effectively reduced even if the deposition has electrical conduction.

Further, since the shield body 36 is made of a dielectric material, the increment of the high-frequency power that is necessary for inductively coupling to the plasma can be restrained, and the plasma can be stably formed and maintained for a prolonged period. Furthermore, since the shield body 36 is made of a dielectric material, the problem of metal contamination due to the shield body being made of metal does not occur.

Fifth Embodiment

FIGS. 11 and 12 show other embodiments of "the structure" pertaining to this invention. Parts that correspond to those in the above fourth embodiment are denoted by the same reference numerals, the detailed description of such parts being omitted.

Figure 11A:
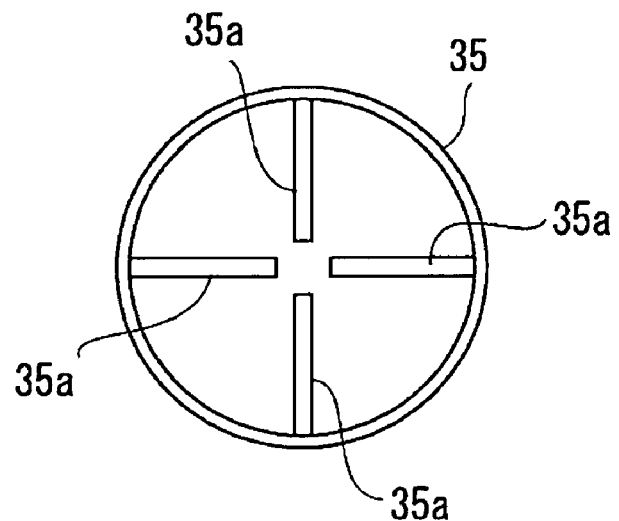
Figure 11B:
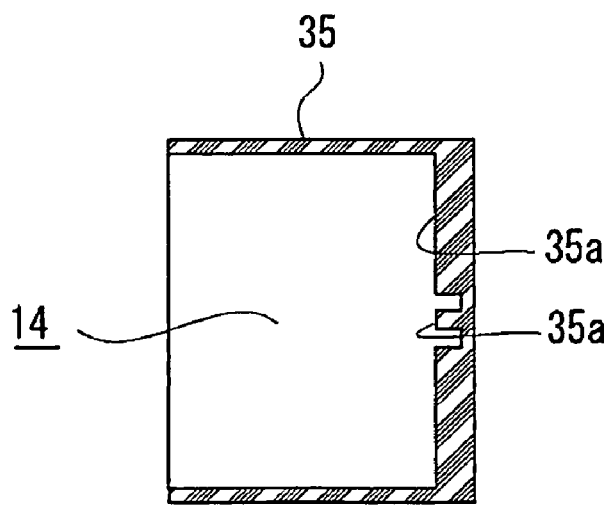

In the embodiment shown in FIGS. 11A and 11B, projections 35a extend in a direction crossing the winding direction of the high-frequency antenna 34 (FIG. 9). The projections 35a are formed on the inner peripheral surface of the cylindrical partition wall 35 partitioning the plasma generating chamber 14. According to this construction, sputtered materials are prevented from depositing onto the inner surface of the top of the partition wall 35 in series in the peripheral direction thereof by the projections 35a. Therefore, the dielectric loss of the high-frequency antenna 34 can be reduced.

When the sputtered materials adhere onto both sides of the projections 35a, the direction of the current flowing to the tip of the projection 35a from the inner surface side of the partition wall 35 and another direction of the current flowing to the inner surface side of the partition wall 35 from the tip of the projection 35a are opposite to each other. Therefore the induced current at this portion can be canceled or reduced.

Although in the embodiment shown in FIG. 11, the projections 35a are formed at four places on the inner peripheral surface of the partition wall 35 at 90-degree intervals about a center thereof, the projection 35a may be formed on only at least one part of the inner peripheral surface of the partition wall 35. Further, the projections 35a may be radially formed equiangularly or non-equiangularly at multiple places.

It is desirable that the height of the projection 35a be equal to or larger than its width (aspect ratio is equal to or more than 1). More specifically, the height of the projection 35a is equal to or larger than 1 mm when the width of the projection 35a is equal to 1 mm. The projection 35a is made of a dielectric material and may be formed integrally with the inner peripheral surface of the partition wall 35 or may be attached as another member.

On the other hand, in the embodiment shown in FIGS. 12A and 12B, recesses 35b extending in the direction crossing the winding direction of the high-frequency antenna 34 (FIG. 9) are provided. The recesses 35b are formed on the inner peripheral surface of the cylindrical partition wall 35 partitioning the plasma generating chamber 14. According to this construction, sputtered materials are prevented from depositing onto the inner surface of the partition wall 35 in series in the peripheral direction thereof by the recesses 35b. Therefore, the dielectric loss of the high-frequency antenna 34 can be reduced.

When the sputtered materials adhere onto both sides of the recess 35b, the direction of the current flowing to the bottom of the recess 35b from the inner surface side of the partition wall 35 and another direction of the current flowing to the inner surface side of the partition wall 35 from the bottom of the recess 35b are opposite to each other. Therefore, the induced current at this portion can be canceled or reduced.

Although in the embodiment shown in FIG. 12, the recesses 35b are formed at four places on the inner peripheral surface of the partition wall 35 at 90-degree intervals, the recess 35b may be formed on only at least one part of the inner peripheral surface of the partition wall 35. Further, the recesses 35b may be radially formed equiangularly or non-equiangularly at multiple places.

It is desirable that the depth of the recess 35b be equal to or larger than its width (aspect ratio is equal to or more than 1 mm). More specifically, the depth of the recess 35 is equal to or larger than 1 mm when the width of the recess 35b is equal to 1 mm.

As described above, the projection 35a or the recess 35b is constructed as "the structure" pertaining to this invention, with the result that an effect similar to the fourth embodiment can be obtained.

Sixth Embodiment

FIGS. 13 and 14 show a sixth embodiment of this invention. Parts that correspond to those in the above fourth and fifth embodiments are denoted by the same reference numerals, the detailed description of these parts being omitted.

in this embodiment, a structure is provided in which the shield body 36 described in the fourth embodiment and the inner surface structure of the partition wall 35 described in the fifth embodiment are combined.

Figure 13A:
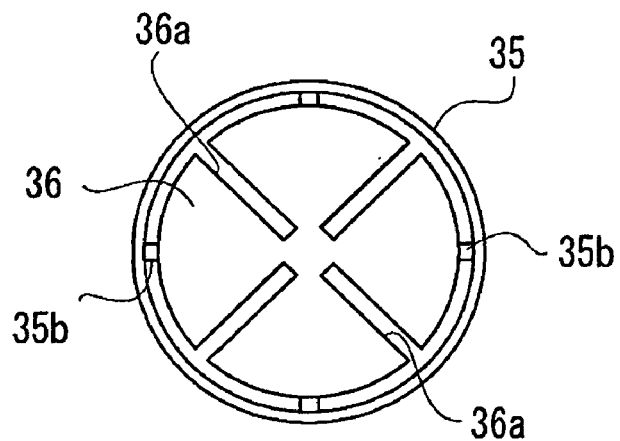
Figure 13B:
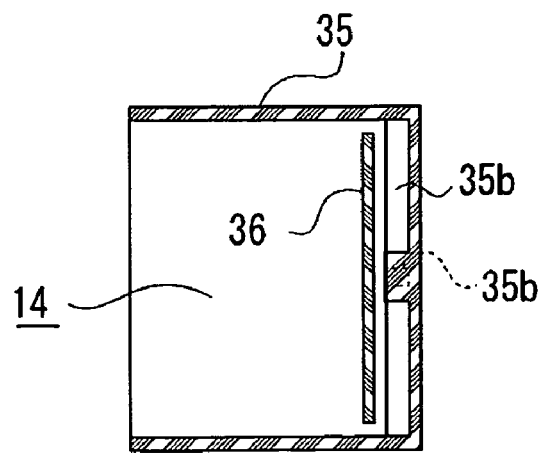

In the embodiment shown in FIGS. 13A and 13B, the recesses 35b are formed on the inner surface of the top of the partition wall 35 partitioning the plasma generating chamber 14. The recesses 35b are extended in the direction crossing the winding direction of the high-frequency antenna 34 (FIG. 9). Further, the shield body 36 is made of a dielectric material and is installed inside the partition wall 35. The slot 36a is formed at the shield body 36 in the direction crossing the winding direction of the high-frequency antenna 34. The shield body 36 is closely installed to the inner surface of the top of the partition wall 35 so that the gap between the both is equal to about 1 mm, as in the fourth embodiment. Therefore, sputtered materials are prevented from invading and adhering onto the inner surface of the partition wall through the gap.

With this construction, when sputtered materials adhere onto the inner wall surface of the top of the partition wall 35 through the gap between the partition wall 35 and the shield body 36, the deposition composed of the sputtered materials is difficult to form in series in the winding direction of the high-frequency antenna 34, with the result that a maintenance cycle can be prolonged. In addition, the slot 36a of the shield body 36 is positioned at a different angle from the recesses 35b of the partition wall 35, which can further improve the effect that the maintenance cycle can be prolonged.

Figure 14A:
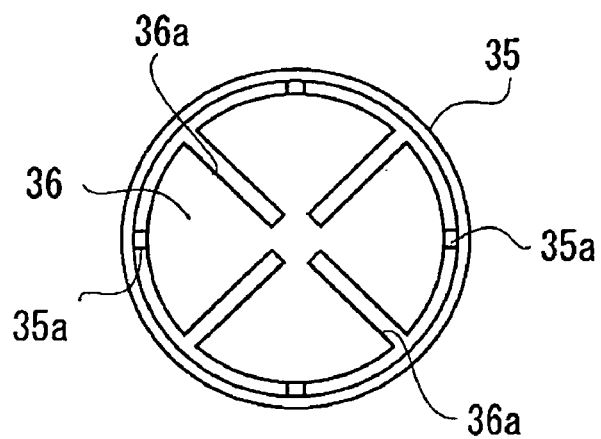
Figure 14B:
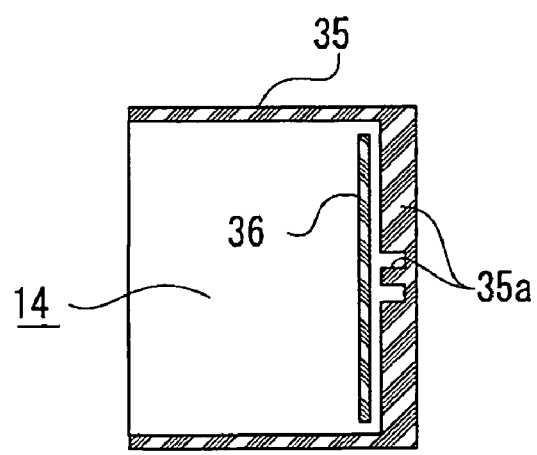

On the other hand, in the embodiment shown in FIGS. 14A and 14B, the projections 35a are formed on the inner surface of the top of the cylindrical partition wall 35 partitioning the plasma generating chamber 14. The projections 35a are extended in the direction crossing the winding direction of the high-frequency antenna 34 (FIG. 9). Further, the shield body 36 is made of a dielectric material and is installed inside the partition wall 35. The slot 36a is formed in a direction crossing the winding direction of the high-frequency antenna 34. The shield body 36 is closely installed to the inner surface of the top of the partition wall 35 so that the gap between the two is equal to about 1 mm, as in the fourth embodiment. Therefore, sputtered materials are prevented from invading and adhering onto the inner surface of the partition wall through the gap.

According to the above construction, the labyrinth structure of the gap between the inner surface of the partition wall 35 and the shield body 36 can be obtained and the effect that the sputtered materials are prevented from adhering in series onto the inner surface of the top of the partition wall 35 is further improved similarly to the above description.

While the preferred embodiments of the invention have been described, without being limited to this, variations thereto will occur to those skilled in the art within the scope of the present inventive concepts that are delineated by the following claims.

For example, in the above embodiments, the ion beam etching apparatus is explained as a plasma generating apparatus. Instead, an ion beam sputtering apparatus that includes a sputtering target installed inside a process chamber and that forms a film by depositing sputtered particles onto a processing substrate, may be constructed as the plasma generating apparatus. Further, this invention can be adapted to another plasma processing apparatus such as a plasma doping apparatus or a plasma etching apparatus.

Figure 15:
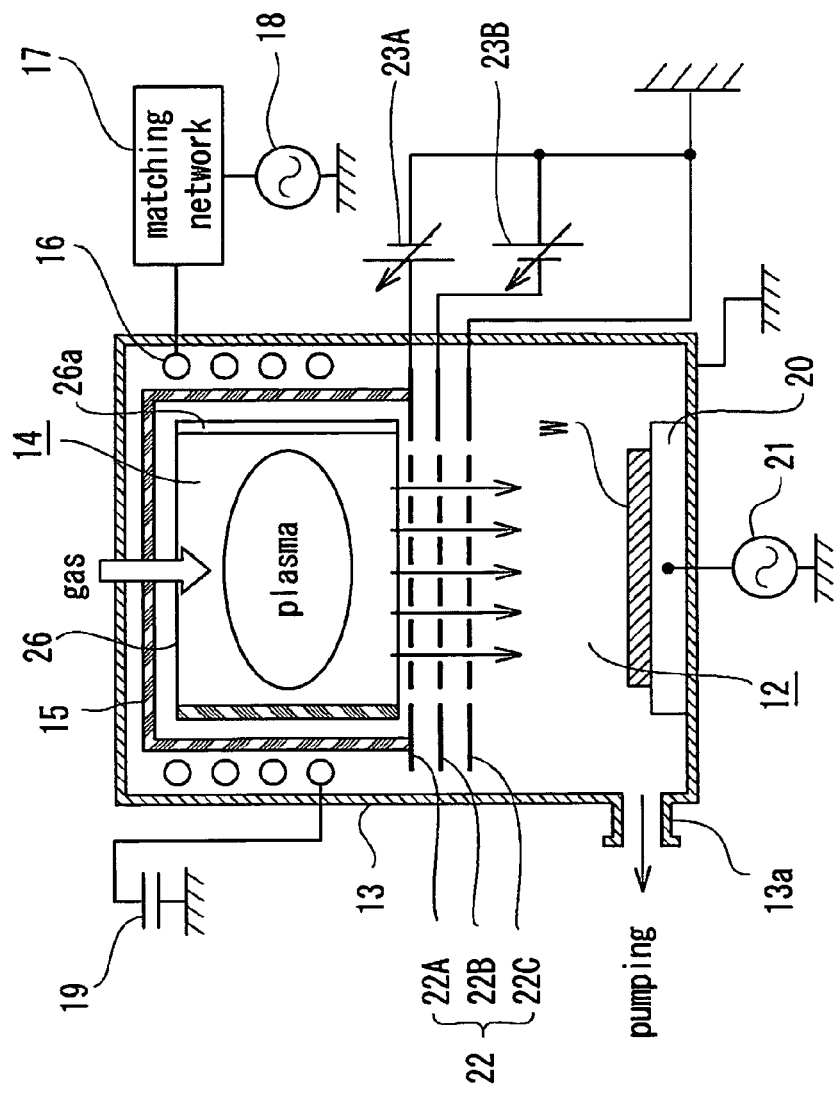
FIG. 15 is a schematic sectional view of a substantial part showing a modification of a construction of an ion source pertaining to this invention.

Further, in the above embodiments, the partition wall (bell jar) 15, 35 is constructed as the external wall defining the borders between air and vacuum. Instead, for example, an ion source pertaining to this invention may be installed inside a vacuum chamber 13, as shown in FIG. 15. The partition wall 15 partitions a plasma generating chamber 14 inside the vacuum chamber 13. A high-frequency antenna 16 is installed on the external portions of the partition wall 15 which is installed inside the vacuum chamber 13. A shield body 26 pertaining to this invention is installed so that the shield body 26 covers the inner peripheral surface of the partition wall 15 opposed to the high-frequency antenna 16.

Furthermore, the shield body 16, 36 pertaining to this invention is formed in a cylindrical or plane shape. Instead, the shape of the shield body can be appropriately changed according to the inner surface shape of the partition wall. For example, the shield body may be formed in a square trunk shape or a dome shape.

The invention claimed is:

1. An ion source, comprising:
a plasma generating chamber;
a partition wall made of a dielectric material and partitioning the plasma generating chamber, the partition wall having a projection;
a high-frequency antenna having a winding and installed at an external portion of said partition wall for generating a plasma in the plasma generating chamber; and
a shield body installed inside the plasma generating chamber the shield body made of a dielectric material, covering the inner surface of the partition wall, and having at least one slot formed therein in a direction crossing a winding direction of the high-frequency antenna,
wherein the projection is made of a dielectric material and formed on at least one part of the inner surface of the partition wall and extended in a direction crossing a winding direction of the high-frequency antenna, and
wherein the shield body has a groove formed on an outer surface thereof to accommodate the projection, the groove formed at a position opposite to the projection in a radial direction of the high-frequency antenna.

2. The ion source according to claim 1 further comprising an extraction electrode for extracting ions from the plasma generated in the plasma generating chamber.

3. A plasma processing apparatus, comprising:
a process chamber for containing a substrate to be processed;
a plasma generating chamber;
a partition wall made of a dielectric material and partitioning the plasma generating chamber, the partition wall having a projection;
a high-frequency antenna installed at an external portion of the partition wall for generating a plasma in the plasma generating chamber; and
a shield body installed inside the plasma generating chamber, the shield body made of a dielectric material, covering the inner surface of the partition wall, and having at least one slot formed therein in a direction crossing a winding direction of the high-frequency antenna,
wherein the projection is made of a dielectric material and formed on at least one part of the inner surface of the partition wall and extended in a direction crossing a winding direction of the high-frequency antenna, and
wherein the shield body has a groove formed on an outer surface thereof to accommodate the projection, the groove formed at a position opposite to the projection in a radial direction of the high-frequency antenna.

4. The plasma processing apparatus according to claim 3, wherein an extraction electrode for extracting ions from the plasma generated in the plasma generating chamber toward the process chamber is installed between the plasma generating chamber and the process chamber.

5. The plasma processing apparatus according to claim 3, wherein a sputtering target irradiated with ions extracted from the plasma generating chamber and depositing sputtered materials onto the substrate to be processed is installed inside the process chamber.

* * * * *